United States Patent [19]

Hamano

[11] Patent Number: 4,825,411

[45] Date of Patent: Apr. 25, 1989

[54] DUAL-PORT MEMORY WITH ASYNCHRONOUS CONTROL OF SERIAL DATA MEMORY TRANSFER

[75] Inventor: Hisanori Hamano, Itami, Japan

[73] Assignee: Mitsubishi Denki Kabushiki Kaisha, Tokyo, Japan

[21] Appl. No.: 66,003

[22] Filed: Jun. 24, 1987

[30] Foreign Application Priority Data

Jun. 24, 1986 [JP] Japan .................. 61-148874

[51] Int. Cl.⁴ .............................................. G11C 7/00
[52] U.S. Cl. .................................... 365/189; 365/230; 365/233; 365/219
[58] Field of Search ............... 365/189, 219, 220, 221, 365/233, 230

[56] References Cited

U.S. PATENT DOCUMENTS

| 4,623,990 | 11/1986 | Allen et al. | 365/230 X |
| 4,688,197 | 8/1987 | Novak et al. | 365/240 X |
| 4,718,039 | 1/1988 | Aichelmann, Jr. et al. | 365/219 X |
| 4,720,819 | 1/1988 | Pinkham et al. | 365/219 |

OTHER PUBLICATIONS

"TMS4161 65, 536-Bit Multiport Video Ram" Engineering Center Mitsubishi Electronic America, Inc. (Jul. 1983).

Primary Examiner—Stuart N. Hecker
Assistant Examiner—Alyssa H. Bowler
Attorney, Agent, or Firm—Birch, Stewart, Kolasch & Birch

[57] ABSTRACT

A dual-port memory includes a memory array comprising a plurality of memory elements one of which is accessed at random by a row and column address input so as to enable writing in or reading out of data; at least two serial access memories capable of receiving parallel input of all or a portion of the data of a selected row or column of said memory array; and a switching circuit for switching the respective serial access memories to be in operational states of receiving parallel inputs independently or to be in operational states of outputting their serial outputs successively.

4 Claims, 5 Drawing Sheets

DUAL-PORT MEMORY WITH ASYNCHRONOUS CONTROL OF SERIAL DATA MEMORY TRANSFER

FIELD OF THE INVENTION

The present invention relates to a dual-port memory including a memory array capable of random accessing and a register capable of serial accessing which memory array and register are both integrated on a substrate.

A dual-port memory of such type is used, for example, for storing picture data to be input to a cathode-ray tube with said picture data being randomly accessed or with said picture data stored in a particular row or column being serially accessed.

BACKGROUND ART

FIG. 1 shows a construction of a prior art dual-port memory. In FIG. 1, reference numeral 1 designates a memory array which is capable of being randomly accessed, and this memory array 1 includes a plurality of memory cells for storing information in an arrangement of m rows and n columns. The reference numeral 2 designates a latch-appended row decoder for selecting memory cells arranged at the respective rows of the memory cell array 1. The reference numeral 3 designates a latch-appended column decoder for selecting memory cells arranged on the respective columns. The reference numeral 4 designates an input/output data control circuit for controlling the reading-out or writing-in of information from the memory cells of the memory array 1. The reference numeral 5 designates a serial access memory to which information in the memory cells at the row selected by the row decoder 2 is input in parallel and output serially. Furthermore, the reference character Ai designates i address inputs which are input to the row decoder 2 and the column decoder 3. The reference character RAS (Row Address Strobe signal) designates a trigger signal for latching the row address, and the reference character CAS (Column Address Strobe signal) designates a trigger signal for latching the column address. The reference character RD designates a reading-out control signal which is input to the I/O data control circuit 4. The reference character WR designates a writing-in control signal which is input to the I/O data control circuit 4. The reference character D designates a data I/O line for outputting information from the memory array 1 and inputting information to the memory array 1 through the I/O data control circuit 4. The reference character DT designates a data transfer control signal which is input to the serial access memory 5. The reference character SC designates a serial clock which is input to the serial access memory 5. The reference character SO designates a serial output through which data is output serially from a serial access memory 5 as data stored in the row of the memory array 1.

The operation of this device will be described with reference to FIG. 2.

When this prior art dual-port memory is operated similarly as usual dynamic RAMs, as address inputs a row address and column address are time sequentially input to the row decoder 2 and the column decoder 3, and they are respectively latched at the internal registers by trigger signals of RAS and CAS, respectively. These row and column addresses are decoded by the decoders 2 and 3, respectively, and the reading-out and writing-in operations from the memory cell of the memory array 1 selected by these decoders 2 an 3 are conducted. When the signal RD is input to the I/O data control circuit 4, the reading-out operation is conducted in which information in the selected memory cell of the memory array 1 is output to the I/O data line D through the I/O data control circuit 4, and when the signal WR is input to the I/O data control circuit 4, the writing-in operation is conducted in which information which is, input to the data I/O line D is input to the selected memory cell 1 through the I/O data control circuit 4.

Next, the operation of transferring data from the memory array 1 to the serial access memory 5 and outputting information in the memory cell at a row of the memory array 1 to the serial output SO will be described.

As shown in FIG. 2, the signal DT is at an "H" level at the rising edge of RAS thereby to indicate the data transfer mode, and the row address r of the row to which the data is to be transferred is input to the address line Ai. The transfer of data from the memory array 1 to the serial access memory 5 is executed at the falling edge of the signal DT. That are the memory cells on a row of the memory array 1 is selected by the row decoder 2, and information in the memory cells of that row selected by the falling edge of the signal DT are transferred in parallel to the serial access memory 5. Then, all or a portion of the column data of a selected column are transferred to the serial access memory 5 in parallel.

Next, when the clock SC is input to the serial access memory 5, the parallel data in the serial access memory 5 are output to the terminal SO serially at each clock.

In the prior art dual-port memory having such a construction, it is necessary to synchronize operation with the serial clocks in order to transfer new row data along with the outputting of signals from the serial access memory successively, and this unavoidably makes the control complicated.

SUMMARY OF THE INVENTION

An object of the present invention is to provide an improved dual-port memory which is capable of transferring data independently of serial clocks.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a dual-port memory which comprises: a memory array comprising a plurality of memory elements one of which is accessed at random by a row and column address input so as to enable writing in or reading out of data; at least two serial access memories capable of receiving parallel input of all or a portion of the data of a selected row or column of said memory array; said memory array and said serial access memories being provided on a substrate; and a switching means for switching the respective serial access memories to be in operational states of receiving parallel inputs independently or to be in operational states of outputting their serial outputs successively.

DETAILED DESCRIPTION OF THE PREFERRED EMBODIMENTS

Figure 3:
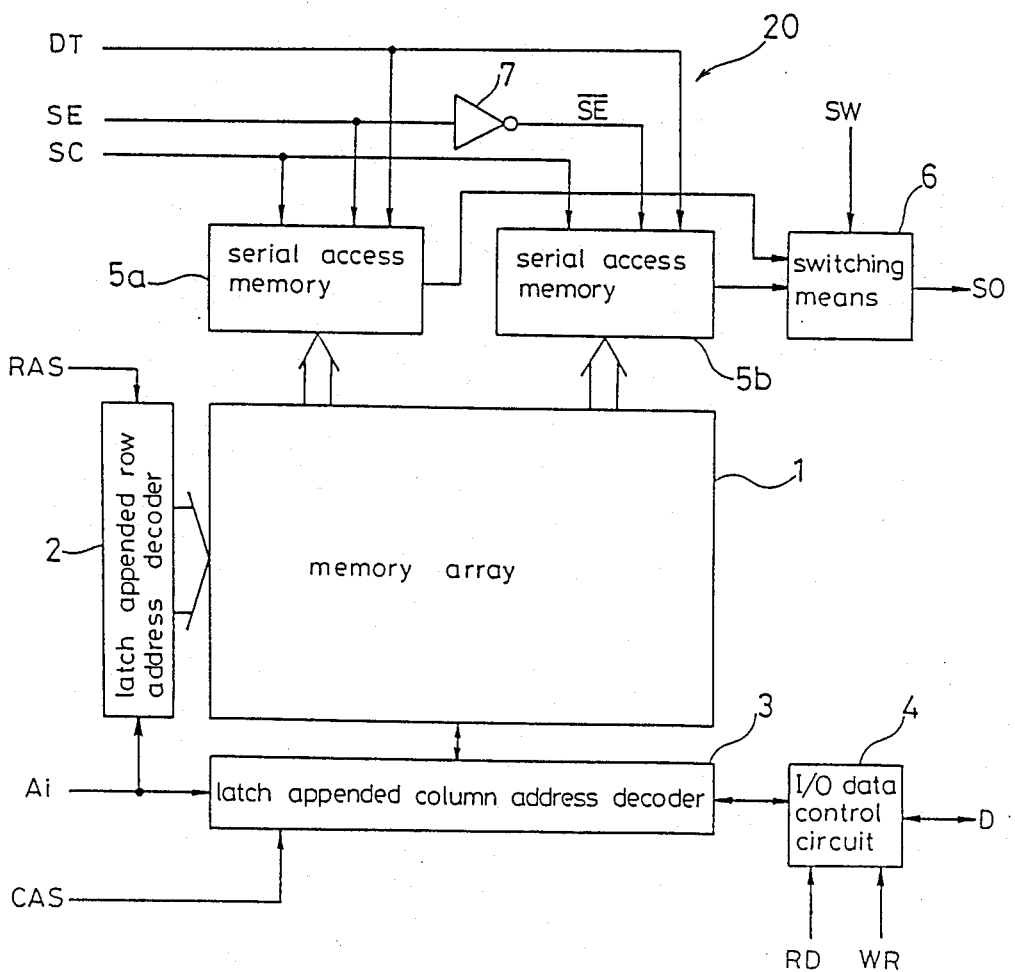
FIGS. 3 and 4 are block diagrams showing a construction and a detailed construction of a dual-port memory of an embodiment of the present invention.
Figure 4:
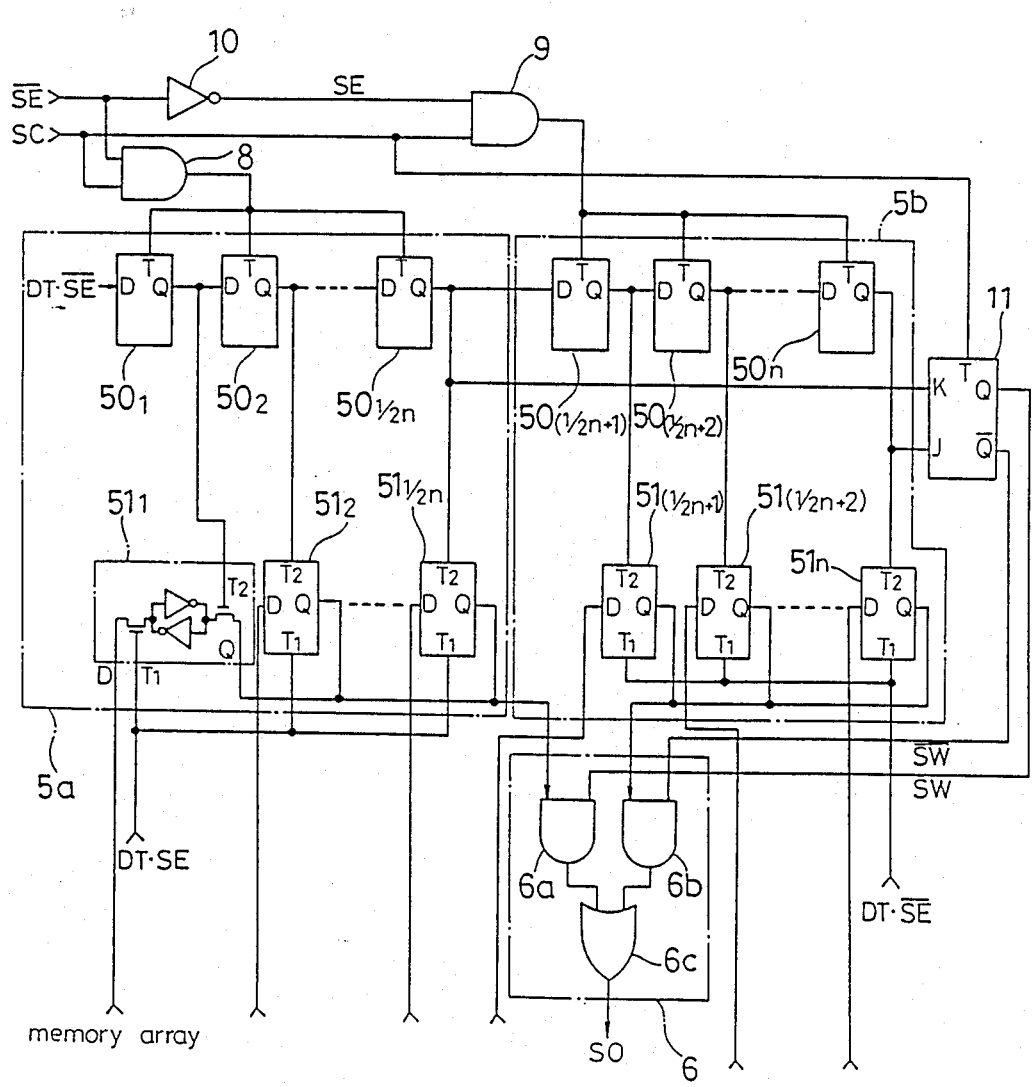

In order to explain the present invention in detail, reference will be particularly made to FIGS. 3 and 4.

FIG. 3 is a schematic diagram of a dual-port memory as a first embodiment of the present invention. In FIG. 3, reference numerals $5a$ and $5b$ designate a first and second serial access memory to which information in a row selected by the row decoder 2 of the memory array 1 is input in parallel and output serially, respectively. A transfer control signal DT, a serial clock signal SC, and selection signals SE and $\overline{SE}$ are input to these first and second serial access memories thereby to control these circuits. The reference numeral 6 designates switching means comprising a multiplexer which receives inputs from the first and second serial access memories $5a$ and $5b$ and outputs one of these inputs in accordance with the switch signal SW. The reference numeral 7 designates an inverter for outputting a selection signal $\overline{SE}$ which is obtained from the selection signal SE.

A switching circuit 20 is constituted by a selection signal SE generator means (not shown), a switch signal SW generator means (not shown), a switch circuit 6, and an inverter circuit 7. This switching circuit 20 allows the respective serial access memories $5a$ and $5b$ to receive parallel inputs independently, and to output serial outputs successively at the time of serial outputting.

FIG. 4 shows detailed constructions of the first and second serial access memories $5a$, $5b$ and the switching circuit 20, which constitute the main portion of the present embodiment. The first serial access memory $5a$ is constituted by a clock counting section comprising $\frac{1}{2}n$ clock counting D type flip-flops $50_1$ to $50_{\frac{1}{2}n}$, and a data latching section comprising the same number of data latching D type flip-flops $51_1$ to $51_{\frac{1}{2}n}$ as that of the clock counting D type flip-flops. In the clock counting section an AND output of the selection signal $\overline{SE}$ and the clock signal SC is input to the T input of the respective clock counting D type flip-flops $50_1$ to $50_{\frac{1}{2}n}$ through the AND gate 8. That is, when the selection signal $\overline{SE}$ is at "H" level, a signal in accordance with the clock signal SC is input to the T input. Furthermore, an AND output of the data transfer signal DT and the selection signal $\overline{SE}$ is input to the D input of the initial stage clock counting D type flip-flop $50_1$. On the other hand, in the data latching section an AND output of the data transfer signal DT and the selection signal SE is input to the respective $T_1$ inputs of the data latching D type flip-flops $51_1$ to $51_{\frac{1}{2}n}$, and the respective Q outputs of the corresponding clock counting D type flip-flops $50_1$ to $50_{\frac{1}{2}n}$ are input to the respective $T_2$ inputs thereof. Furthermore, the respective D inputs of the respective data latching D type flip-flops $51_1$ to $51_{\frac{1}{2}n}$ are connected to the corresponding column line of the memory array 1, and information stored in the memory cell at the selected row is input thereto. Accordingly, in this first serial access memory $5a$, when the AND output of the data transfer signal DT and the selection signal SE is at "H" level, stored information in the row selected in the memory array 1 is latched to the data latching D type flip-flops $51_1$ to $51_{\frac{1}{2}n}$, and this latched information is output in accordance with the respective Q outputs of the clock counting D type flip-flops $50_1$ to $50_{\frac{1}{2}n}$. The respective Q outputs of the clock counting D type flip-flops $50_1$ to $50_{\frac{1}{2}n}$ become "H" level subsequently stage-by-stage based on the clock signal SC after the AND output of the data transfer signal DT and the selection signal $\overline{SE}$ becomes "H", and therefore, the respective Q outputs of the data latching D type flip-flops $51_1$ to $51_{\frac{1}{2}n}$ output stored information which is successively latched based on the clock signal SC.

The second serial access memory $5b$ has a similar construction as that of the first serial access memory $5a$, and it is constituted by a clock counting section comprising a plurality of clock counting D type flip-flops $50_{\frac{1}{2}n+1}$ to $50_n$ in a cascade connection and a data latching section comprising a plurality of data latching D type flip-flops $51_{\frac{1}{2}n+1}$ to $51_n$. The Q output of the final stage clock counting D type flip-flop $50_{\frac{1}{2}}$ in the first serial access memory $5a$ is input to the D input of the first stage clock counting D type flip-flop $50_{\frac{1}{2}n+1}$ of the clock counting section. Memory $5b$ has the same construction as that of the first serial access memory $5a$ except for the selection signal being in a relation reverse to the selection signal input to the first serial access memory $5a$. Accordingly, in this second serial access memory $5b$, when the AND output of the data transfer signal DT and the selection signal $\overline{SE}$ is at "H" level, information stored in a memory cell of the selected row of the memory array 1 is latched to the data latching D type flip-flops $51_{\frac{1}{2}n+1}$ to $51_n$ of the corresponding memory cell, and this latched information is output in accordance with the Q output of the clock counting D type flip-flops $50_{\frac{1}{2}n+1}$ to $50_n$. The respective Q outputs of the clock counting D type flip-flops $50_{\frac{1}{2}n+1}$ to $50_n$ become "H" level successively stage-by-stage based on the clock signal SE after the Q output of the final stage clock counting D type flip-flop $50_{\frac{1}{2}n}$ of the first serial access memory $5a$ becomes "H" level, and thus the respective Q outputs of the data latching D type flip-flops $51_{\frac{1}{2}n+1}$ to $51_n$ output the stored information which is latched successively based on the clock signal SC.

The switch signal SW generator means 11 comprises a JK type flip-flop, and a clock signal SC is input to the T input thereof. The Q output of the final stage clock counting D type flip-flop $50_{\frac{1}{2}n}$ of the first serial access memory $5a$ is input to the K input thereof, and the Q output of the final stage clock counting D type flip-flop $50_n$ of the second serial access memory $5b$ is input to the J input. When the K input becomes "H" level, the Q and $\overline{Q}$ output become "L" and "H" level, respectively, and when the J input becomes "H" level, the Q and $\overline{Q}$ outputs are inverted to become "H" and "L" level, respectively. Accordingly, the switch signal SW generator means 11 indicates which of the first and second serial access memories $5a$ and $5b$ have concluded the serial transmission of the latched information.

The switching circuit 6 comprises a first AND gate $6a$ which receives the respective Q outputs of the data latching D type flip-flops $51_1$ to $51_{\frac{1}{2}n}$ of the first serial access memory $5a$ and the switch signal SW (Q output) of the switch signal generator means 11, a second AND gate $6b$ which receives the respective Q outputs of the data latching D type flip-flops $51_{\frac{1}{2}n+1}$ to $51_n$ of the second serial access memory $5b$ and the switch signal SW ($\overline{Q}$ output) of the switch signal generator means 11, and an OR circuit $6c$ which receives the output of the first and second AND gates $6a$ and $6b$. This switching circuit 6 is designed to output information stored in the data latching section of the first and second serial access memories $5a$ and $5b$ as serial output SO in accordance with the switch signals SW and $\overline{SW}$ (Q and $\overline{Q}$ output) of the switch signal generator means 11.

Figure 1:
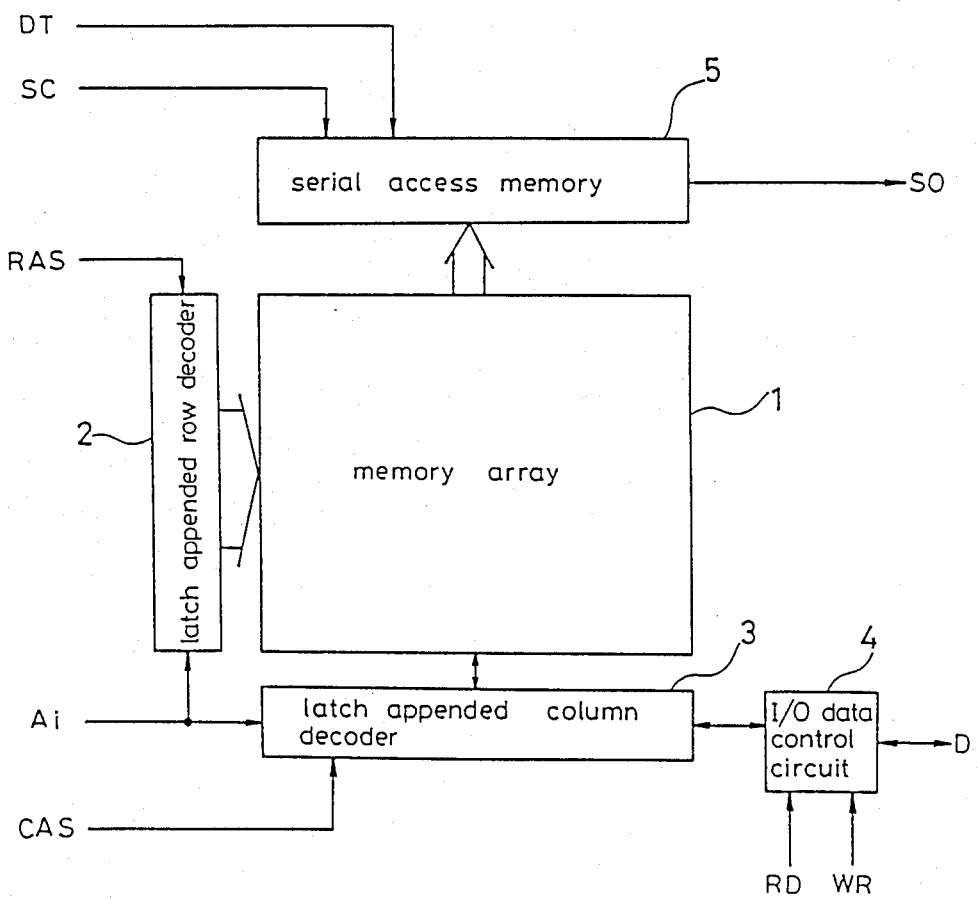
FIG. 1 is a block diagram showing a construction of a prior art dual-port memory.
Figure 2:
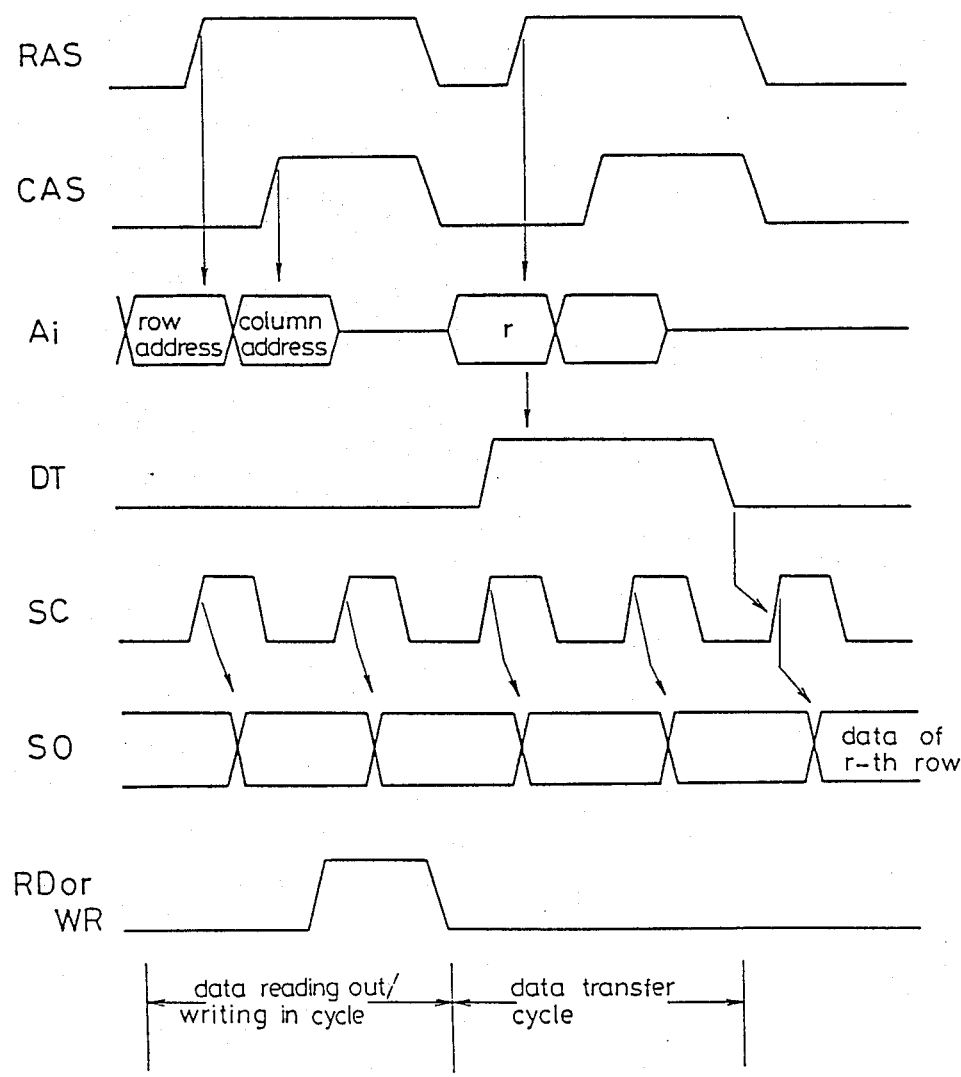
FIG. 2 is a timing chart for explaining the operation of the device of FIG. 1.

The operation of this dual-port memory will now be described. The operation of this dual-port memory as a usual dynamic RAM is the same as that of the prior art device shown in FIG. 1. The operation of the device when used to output the serial output SO will be described.

First, the operation of this embodiment will be described briefly with reference to FIG. 3.

The switching circuit 20 detects that either of the serial access memories $5a$ and $5b$ has become empty by counting the serial clock pulses SC, and when such a state is detected the selection signal SE and the switch signal SW are switched so that the other serial access memory enters an operating state and the switching circuit 6 selects the other serial access memory. During the operation of the other serial access memory, a data transfer control signal DT is generated to conduct data transmission to the serial access memory which is halted in operation.

Figure 5:
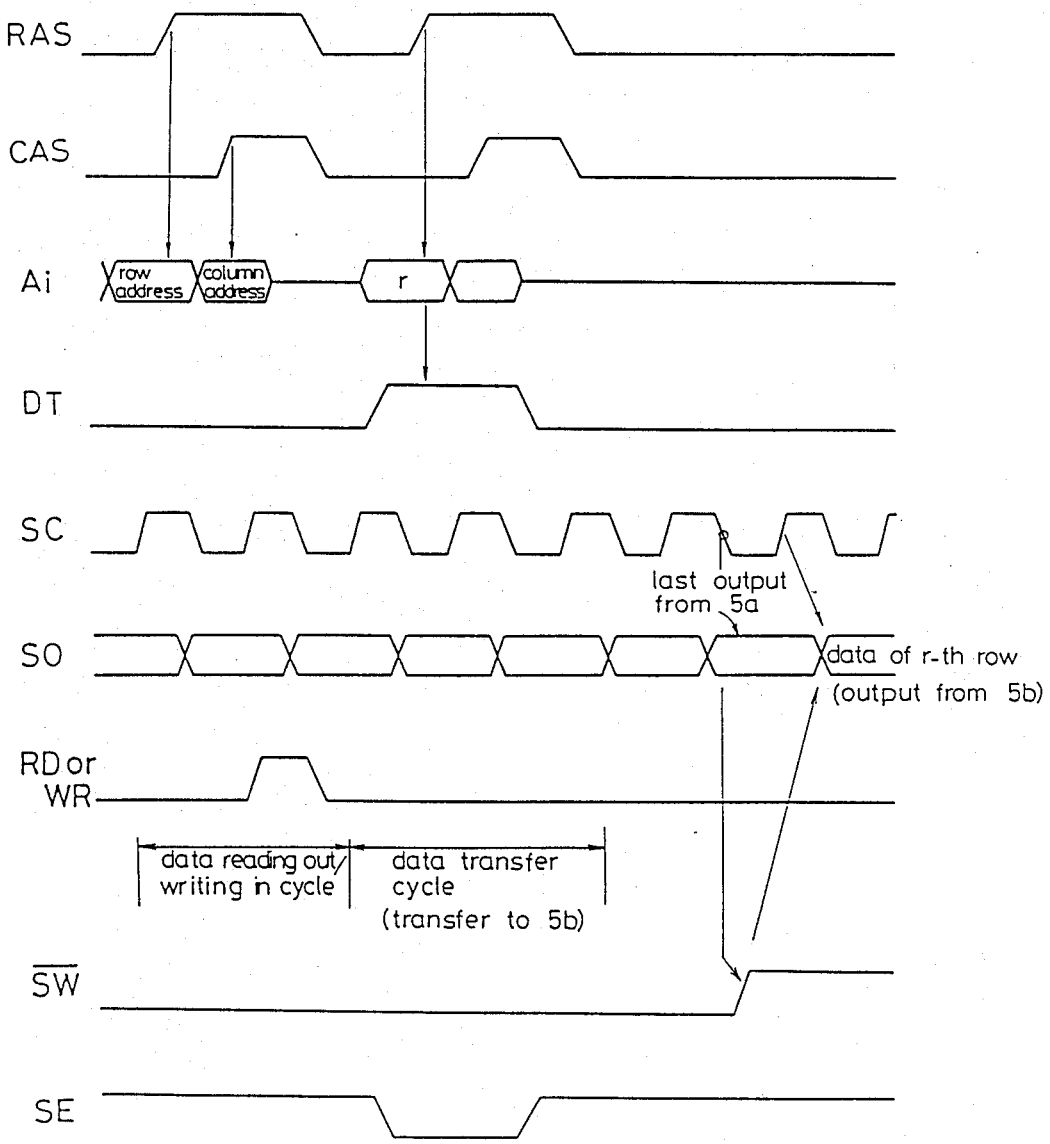
FIG. 5 is a timing chart for explaining the operation or the device of FIG. 3.

This operation including the operations of the respective sections caused by the selection signal SE and the switch signal SW will be described in detail with reference to FIGS. 4 and 5.

When data is transferred to the serial access memory $5a$ or $5b$ from the memory array 1, the selection signal SE determines which serial access memory data is to be transferred to. When the serial access memory $5a$ is outputting serial data to the terminal SO synchronous with the clock SC, the serial access memory $5b$ is halted in operation. When the data transfer signal DT becomes "H" level and the selection signal SE becomes "L" level as shown in FIG. 5 then, the AND output of both signals DT and SE becomes "L" level, the data latching D type flip-flops $51_1$ to $51_{\frac{1}{2}n}$ of the first serial access memory $5a$ remain cut off from the memory array 1, and it continues to output the serial output SO through the switching means 6 based on the clock signal SC. On the other hand, the selection signal $\overline{SE}$ becomes "H" level, the AND output of the data transfer signal DT and the selection signal $\overline{SE}$ becomes "H" level, and the data latching D type flip-flops $51_{\frac{1}{2}n+1}$ to $51_n$ of the second serial access memory $5b$ and connected to the memory array 1. Thus, a portion of the row data of the row selected by the row address decoder 2 triggered by the RAS signal shown in FIG. 5 will be latched to the data latching D type flip-flops $51_{\frac{1}{2}n+1}$ to $51_n$.

Thereafter, when the first serial access memory $5a$ concludes the outputting of a predetermined data, that is, the Q output of the final stage clock counting D type flip-flop $51_{\frac{1}{2}n}$ of the clock counting section becomes "H" level, the Q and $\overline{Q}$ outputs of the switching signal generator 11 are inverted, and only the data of the second serial access memory $5b$ is output from the switching means 6. As a result, the information latched at the data latching D type flip-flops $51_{\frac{1}{2}n+1}$ to $51_n$ of the second serial access memory $5b$ are output through the switching means 6 at serial output SO synchronous with the clock signal SC. Then, if the data transfer signal DT is made "H" level and the AND output of the data transfer signal DT and the selection signal SE is made "H" level, the information stored in the memory cell of the row selected by the row address decoder 2 in the memory array 1 can be latched to the data latching D type flip-flops $51_1$ to $51_{\frac{1}{2}n}$ in the first serial access memory $5a$.

Thus, the serial access memories $5a$ and $5b$ are operated alternatively in this embodiment, whereby transfer of the data to the serial access memory which is halted in operation can be conducted easily and asynchronously with the serial clock.

In the above-described embodiment, all the data of one row selected among the rows of the memory array are transferred to the serial access memory, but the data of one selected column may be transferred to the serial access memory with the same effects as described above.

Furthermore, the data to be transferred is not always all the data of one row or one column, but it may be a portion thereof.

Furthermore, a serial access memory is divided into two in the above illustrated embodiment, but more than two serial access memories may be provided with the same effects as described above.

As is evident from the foregoing description, according to the present invention, a serial access memory is divided into a plural number so as to be operated alternatively, whereby timing of the data transfer from the memory array to the serial access memory may not be required to be synchronous with the serial clock, or it may be transferred at any time during operation of the other serial access memory. Thus, the establishment of the timing of the data transfer is simplified to a great extent without injuring the continuity of the serial output.

What is claimed is:

1. A dual-port memory comprising:
    a memory array including a plurality of memory elements each of which is accessed at random by a row and column address input to enable writing in or reading out of data thereat;
    a first serial access memory which receives and latches a first portion of the data of the memory elements of a selected row or column of said memory array in parallel when a data transfer signal is at a first level and a selection signal is at a first level, and which outputs the latched parallel data serially in synchronism with a clock signal when said selection signal is at a second level; and
    a second serial memory which receives and latches a second portion of the data of the memory elements of a selected row or column of said memory array in parallel when said data transfer signal is at said first level and said selection signal is at said second level, and which outputs the latched parallel data serially in synchronism with said clock signal when said selection signal is at said first level.

2. A dual-port memory as defined in claim 1, wherein further including switch signal generator means for detecting the conclusion of serial data outputting of said first serial access memory and said second serial access memory to output a switching signal, and switching means for selectively outputting the serial data output of said first or second serial access memory in response to said switching signal of said switch signal generator means, said switching means being connected to the serial data outputs of said first and second serial access memories.

3. A dual-port memory, comprising:
- a memory array including a plurality of memory elements arranged in rows and columns each of which is accessed randomly by a row and column address signal;
- at least two serial access memories having inputs for receiving parallel data from selected memory elements of said memory array and outputs for serially outputting received data; and
- switching means for switching the operation of said serial access memories between a first state in which one of said serial access memories outputs stored data and the other serial access memory receives parallel data from said memory array, and a second state in which said one serial access memory receives parallel data from said memory array and said other serial access memory outputs stored data.

4. A dual-port memory as defined in claim 3, further comprising:
- clock generator means for generating a clock signal used in the outputting of serial data by said serial access memories, each of said serial access memories receiving said parallel data asynchronously with said clock signal.

* * * * *